United States Patent [19]

Grobman et al.

[11] Patent Number: 5,060,116

[45] Date of Patent: Oct. 22, 1991

[54] ELECTRONICS SYSTEM WITH DIRECT WRITE ENGINEERING CHANGE CAPABILITY

[76] Inventors: Warren D. Grobman, 202 Drew La., Carmel, N.Y. 12512; Charles J. Kraus, deceased, late of Chatham, Mass.; by Paula A. Kraus, executrix, 28 Somerset Dr., Chatham, Mass. 02633; Leon L. Wu, Dogwood Rd., Box 98, R.D. 6, Hopewell Junction, N.Y. 12533; Herbert I. Stoller, 26 Sabra La., Wappingers Falls, N.Y. 12590

[21] Appl. No.: 513,342

[22] Filed: Apr. 20, 1990

[51] Int. Cl.$^5$ ............................................. H05K 1/18
[52] U.S. Cl. .................................... 361/474; 361/409; 174/254; 29/847
[58] Field of Search ............... 361/414, 400, 403, 406, 361/409; 174/254; 29/847, 426.1, 426.2; 219/121.6, 121.67, 121.68, 121.69, 121.7

[56] References Cited

U.S. PATENT DOCUMENTS

| | | | |
|---|---|---|---|
| 4,016,463 | 4/1977 | Beall et al. | 361/383 |
| 4,245,273 | 1/1981 | Feinberg et al. | 361/382 |
| 4,254,445 | 3/1981 | Ho | 361/392 |
| 4,489,364 | 12/1984 | Chance et al. | 361/395 |
| 4,549,200 | 10/1985 | Ecker et al. | 357/80 |
| 4,652,974 | 3/1987 | Ryan | 361/395 |
| 4,667,404 | 5/1987 | Reisman et al. | 29/847 |
| 4,710,592 | 12/1987 | Kimbara | 174/68.5 |
| 4,746,815 | 5/1988 | Bhatia et al. | 307/303 |
| 4,764,644 | 8/1988 | Reisman et al. | 174/68.5 |
| 4,799,128 | 1/1989 | Chen | 361/414 |
| 4,803,595 | 2/1989 | Kraus et al. | 361/412 |

FOREIGN PATENT DOCUMENTS 0116927 8/1984 European Pat. Off. .
0171783 2/1986 European Pat. Off. .
59-9679 7/1984 Japan .

OTHER PUBLICATIONS

IBM Technical Disclosure Bulletin, vol. 27, No. 3, Aug. 1984, by C. J. Kraus et al., p. 1601.
IBM Technical Disclosure Bulletin, vol. 24, No. 11A, Apr. 1982, by Hubacher, pp. 5554–5557.

Primary Examiner—Leo P. Picard
Assistant Examiner—Paramita Ghosh
Attorney, Agent, or Firm—Ira D. Blecker; Donald M. Boles

[57] ABSTRACT

A electronics system and method are provided which allow engineering changes to be made to a substrate without requiring the addition of fly wires and without requiring relatively large areas of pads for attaching these wires. Each device site is surrounded by a series of engineering change ring patterns. A series of engineering change patterns allow change interconnections between device sites to be made. Fan-in metallizations extend inwardly to the device sites from these change patterns, with a series of vias making surface connections adjacent to the ring patterns. Fan-out metallizations extend from the device site pads to the ring patterns, with a series of vias making surface connections adjacent to the ring patterns. Engineering changes are made by directly writing surface metal deposits to make the appropriate connections between the vias and the ring pattern. The original chip pad connections and the new ring pattern connections can be appropriately isolated by laser deletions, if necessary.

39 Claims, 9 Drawing Sheets

ELECTRONICS SYSTEM WITH DIRECT WRITE ENGINEERING CHANGE CAPABILITY

TECHNICAL FIELD

This invention relates to an electronics system in which the interconnections between its constituent parts may be modified without adding discrete wiring and to a method for making these modifications. More particularly, in a preferred embodiment, this invention relates to a system which allows changes to be made by connecting integrated circuit chip interconnections to a series of ring patterns surrounding the chips by direct write surface metal deposition and then connecting this pattern by similar deposition to an engineering change network subsisting throughout an entire electronics substrate.

DESCRIPTION OF PRIOR ART

Current circuit fabrication techniques integrate thousands or millions of individual active devices on a single chip. Very large numbers of electrical connections are required to allow communication between these devices, as well as to allow communication between the large numbers of chips which may be mounted on a single substrate. A typical module embodying such a substrate is disclosed in Feinberg, U.S. Pat. No. 4,245,273.

Such substrates, normally made of ceramic material, are very complex, containing 30 or more layers of green ceramic sheets with hundreds of thousands of vias and printed lines which form the internal circuit networks. After the substrate has been laminated and sintered, there is no practical way to change the buried network. Because of the complicated nature of these substrates and the chips mounted upon them, it is often necessary to make changes to the electrical connections, either to accommodate design changes or to correct manufacturing defects.

The basic concept for implementing these so-called engineering changes is to bring the internal wiring to the surface of the substrate, allowing modifications to be made by interrupting the imbedded wiring and routing an engineering change fly wire between the desired connection points. This concept is illustrated in Beall, U.S. Pat. No. 4,016,463, and in Ho, U.S. Pat. No. 4,254,445. The surface connection point is a relatively large pad for bonding the fly wire, on the order of 200 um by 400 um, which is joined by a deletable link to the substrate surface intersection of the internal wiring. This is disclosed in Feinberg, U.S. Pat No. 4,245,273. A variation of this design, in which the pads are located on a staggered grid, is disclosed in Japanese Patent Application 59-96797.

This concept requires a separate pad and deletable link for each chip connection. As the level of circuit integration increases, the number of chip interconnections and therefore the number of required change pads increases. It is anticipated that future high performance system chips will have greater than 600 chip connections. This constitutes approximately a three-fold increase from present systems with a resulting increase in the number of engineering change pads which will be required. This requirement will result in a larger proportion of substrate area being occupied by change pads, as opposed to circuit chips. The chips will therefore be placed further apart with the signal time delays between chips becoming greater. This is undesirable, however, because of the shorter cycle time requirements of advanced systems.

The conventional concept also requires a discrete wire to be routed between the two points which must be connected by the engineering change. As electronics substrate sizes increase to beyond 100 mm square, change wire lengths will also increase. The wiring problem is compounded by the increasing numbers of connections required, which will grow proportionally with the number of chip connections.

Solutions which have been proposed to the problems presented address both the need for engineering change pads and the need for excessive fly wire lengths. Hubacher, IBM Technical Disclosure Bulletin Vol. 24, No. 11A, April, 1982, pp. 5554-5557, proposes a design in which a single engineering change pad can be shared between two chip interconnections. This solution partially alleviates the substrate area requirements as the number of chip interconnections increases, but does nothing to solve the wiring problem. Chance, U.S. Pat. No. 4,489,364, on the other hand, eliminates the problem of long wiring runs but does not solve the problem of increasing change pad requirements. It addresses the change wire length problem by providing sets of dumbbell shaped engineering change links between chips which are attached to a wiring network internal to the substrate. The center portions of the change links can be severed where required, allowing the internal wiring to take the place of the majority of the fly wire lengths. Variations of this solution are disclosed by Feinberg in European Patent Application 0,116,927 and by Yamamoto in European Patent Application 0,171,783.

A number of solutions have been proposed which attempt to solve the above-mentioned problems by adding additional hardware items. Kraus, U.S. Pat. No. 4,803,595, proposes using interposers comprising multiple internal wiring planes which are inserted between the chips and the substrate. This solution has the potential to eliminate both fly wires and engineering change pads. It has the disadvantage, however, of adding complicated hardware items which may themselves require engineering changes. Ryan, U.S. Pat. No. 4,652,974, uses engineering change devices which are customized as required to modify predetermined interconnections. These devices are bonded to the areas between chips where the chip connections fan out to engineering change pads. These change pads are much smaller than those used in the conventional engineering change method, not requiring a large area for wire bonding. This design requires precise positioning of the change devices in addition to requiring a plurality of the devices. A multilevel packaging system is shown in Ecker, U.S. Pat. No. 4,549,200, which requires both engineering change pads and fly wires, albeit a reduced number.

Solutions to the engineering change problem exist which employ a three-dimensional wiring system, using openings in a given wiring layer to allow access to inner layers of the substrate. These solutions are disclosed in U.S. Pat. Nos. 4,667,404; 4,710,592; and 4,764,644.

In Bhatia, U.S. Pat. No. 4,746,815, a set of electronic switches internal to the chip is used to eliminate many of the required engineering change pads. Although this approach significantly reduces the number of required engineering change pads, it does not eliminate the need for long fly wire lengths.

A proposal by Stoller in IBM Technical Disclosure Bulletin Vol. 27, No. 3, August, 1984, p. 1601, proposes the use of discrete engineering change wiring planes. This approach does not resolve the problem of manufacturing defects, nor does it provide a means to make rapid design changes.

As system performance requirements increase and the number of required interconnections increase, it becomes necessary to solve the problems of the excessive area required for engineering change pads and of the increasing volume and length of fly wires required. These problems should be solved without requiring additional complex hardware items or additional electronics.

BRIEF SUMMARY OF THE INVENTION

A need exists for an electronics system and method for making engineering changes without requiring the use of bonded wires and large areas of engineering change pads.

Given these requirements, it is an object of the present invention to provide a system and method for making engineering changes without using bonded fly wires.

It is another object of the present invention to make these changes without requiring large areas of relatively large engineering change pads for the bonding of fly wires.

It is yet another object to implement the first two objectives without requiring additional articles of manufacturing to be added to the electronics system, using conventional electronics fabrication techniques.

These and other objects are achieved in the present invention by an electronics system which includes a supporting substrate composed of layers of insulating and conducting material, a plurality of device sites on the substrate, electrical interconnections between a multiplicity of these device sites, input/output means for connecting electrical signals to entities external to the substrate, and means for changing said electrical interconnections between device sites. The means for changing these electrical interconnections include electrically conductive ring patterns surrounding each device site, a series of engineering change patterns which extend at least between adjacent device sites, means for connecting a predetermined interconnection to the ring patterns, and means for connecting the ring patterns to at least one engineering change pattern.

This invention also provides a method for changing said electrical interconnections between device sites in an electronic system which includes the steps of connecting a predetermined interconnection to an electrically conductive ring pattern surrounding each device site and connecting this ring pattern to an engineering change electrically conductive pattern which extends between device sites.

BRIEF DESCRIPTION OF THE DRAWINGS

In the accompanying drawings forming a material part of this disclosure.

DETAILED DESCRIPTION OF THE INVENTION

Figure 1:
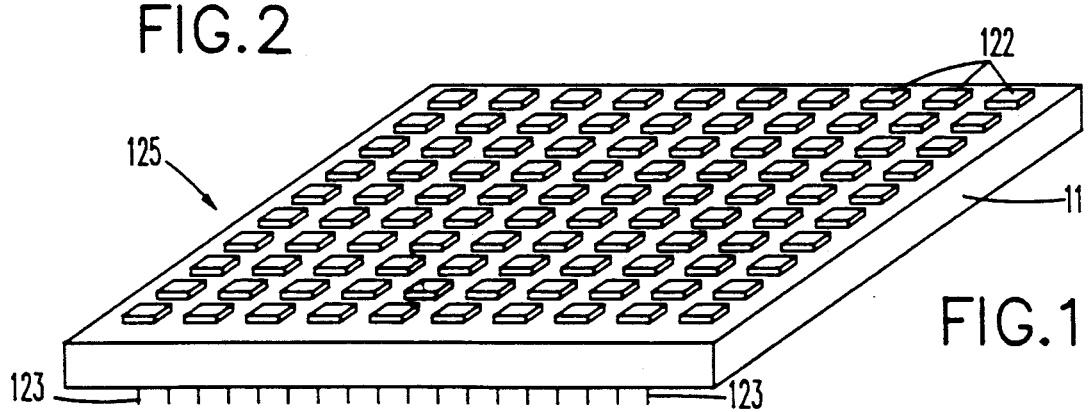
FIG. 1 shows an array of chips on a substrate.

Referring to the drawings in more detail and particularly referring to FIG. 1, there is shown the electronics system 125 according to the present invention. The electronics system 125 comprises a supporting substrate. For the purposes of the present invention, the preferred supporting substrate is an electronics multilayer ceramic substrate 11, shown with a plurality of integrated circuit chips 122 mounted on the device sites. It should be understood that this choice of supporting substrates is for purposes of illustration and not for limitation. As will become clear hereafter, the supporting substrate could also be any other substrate capable of supporting electronic device sites. In particular, the substrate could be the integrated chip itself, with the device sites comprising regions of that integrated circuit chip.

The system also comprises input/output means for connecting the system to other systems. These are shown as pins 123 in FIG. 1, but could be any combination of pins, connectors, metallized pads, or other connection means.

Figure 3:
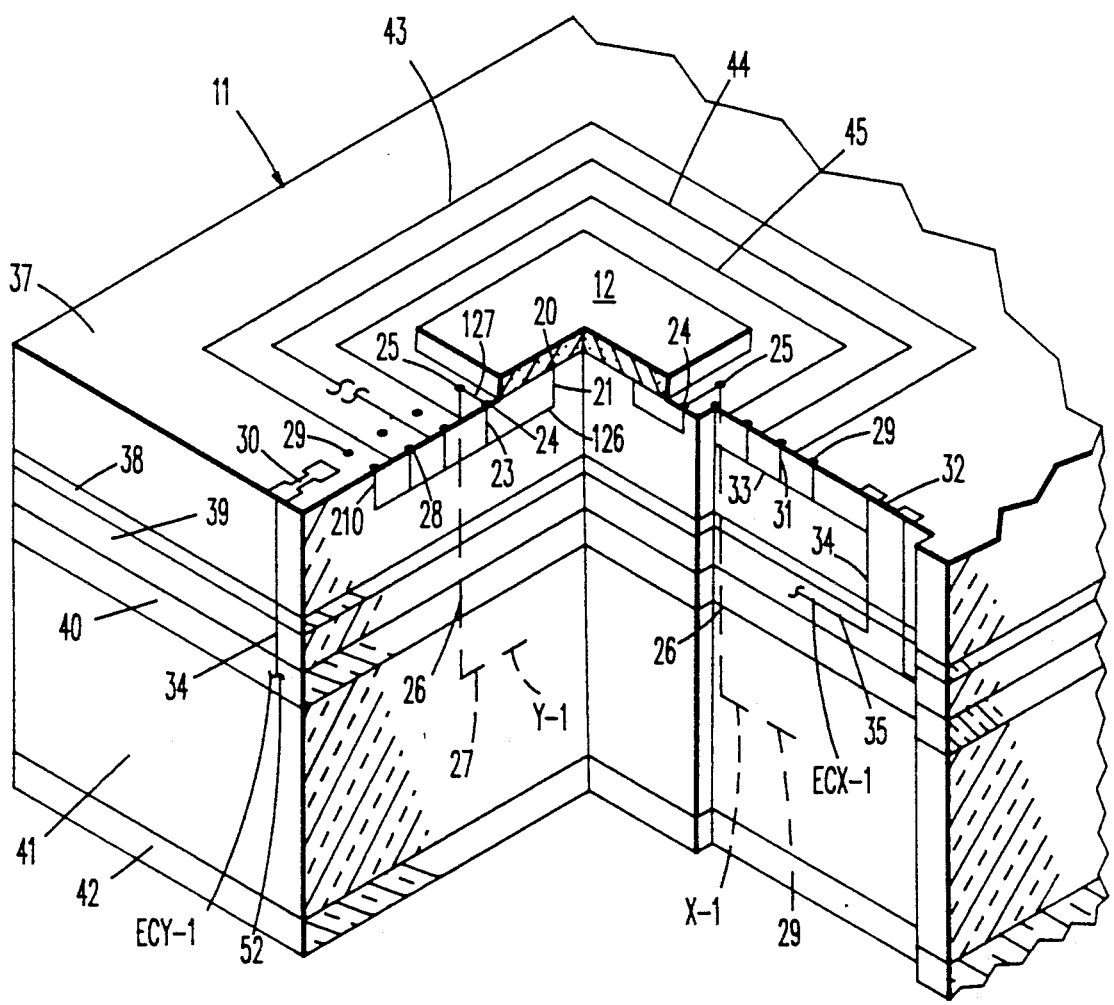
FIG. 3 is a perspective view illustrating a single chip mounted on a substrate, the subsurface layers of the substrate, and the interconnect wiring of the system.

Next, the system comprises electrical interconnections between these device sites. Referring to FIG. 3, these interconnections are exemplified by network metallizations X-1 29 and by Y-1 27.

Figure 2:
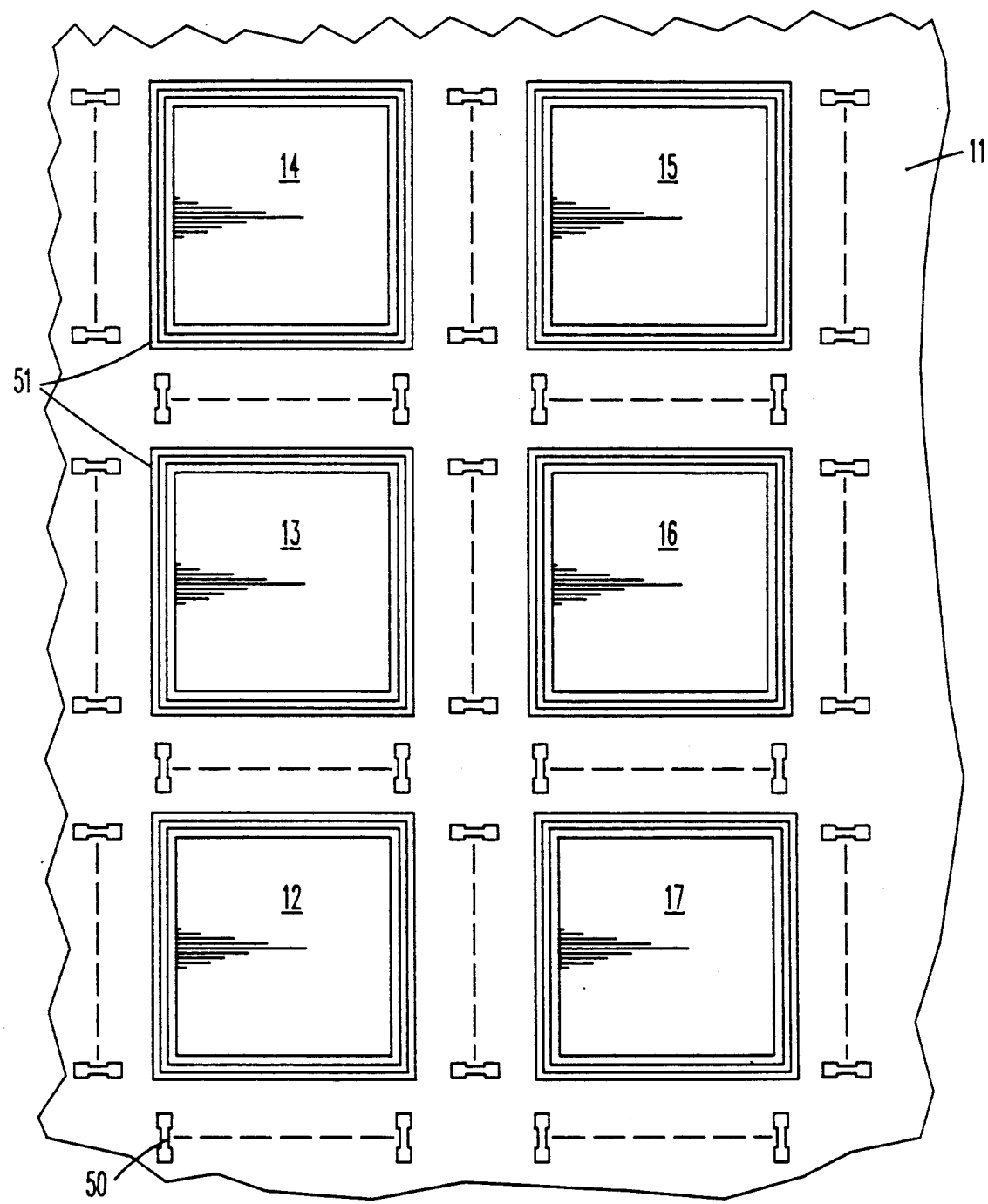
FIG. 2 is a plan view showing a portion of an electronics substrate with chips mounted thereto, the chips being surrounded by ring patterns and engineering change patterns.

An important aspect of this system is a means for changing the electrical interconnections between device sites. Referring to FIG. 2, a plurality of chips 12 to 17 are shown mounted on substrate 11. The means for changing interconnections comprises electrically conductive ring patterns 51 and engineering change surface metallization links 50 which together with sub-surface metallizations comprise engineering change patterns which extend between device sites. The changing means further comprises means for connecting the ring pattern to the change pattern and means for connecting a predetermined connection to a ring pattern. The exact mechanism for making these connections will become more apparent hereafter, but may include the fan-out wiring 126 and fan-in wiring 33, shown in FIG. 3. It may also be desirable while implementing an engineering change to a predetermined connection to isolate the portions of the ring pattern and the change pattern comprising the changed connection from the remainder of these patterns, but this may not always be necessary.

A cross-section of the substrate 11 at one of the device sites where a chip 12 is mounted is shown in FIG. 3. The chip is mounted on the substrate by solder ball joints (not shown) using conventional C-4 (Controlled Collapse Chip Connection) solder ball technology to a set of C-4 pads 20, only one of which is shown. Chips to be used in future advanced systems may have more than several hundreds of these pad connections. The pads are connected to fan-out subsurface metallization 126 embedded in a dielectric material, for example polyimide thin-film or ceramic, by metallized wiring vias 21. This fan-out metallization is located in the fan-out metallization layer 37 of the substrate 11, the uppermost layer in this embodiment.

This fan-out metallization is connected to a first fan-out pad 24, approximately 15 microns in diameter, by a via 23. This first pad 24 is connected to a logic service terminal (LST) 25, also 15 microns in diameter, by LST surface metallization 127, which is approximately 25 microns in width. This LST 25 is connected by via 26 to network subsurface metallization Y-1 27, located in the section of the substrate containing signal distribution layers 41. The chip pad connection is ultimately connected to another chip pad connection on a different device site by identical means after being routed through the signal distribution layer 41. Between layers 37 and 41 are a power distribution layer 38 and the engineering change (EC) layer which includes an upper portion 39 for the parallel array of buried ECX lines such as ECX-1 35 and a lower portion 40 for the parallel array of buried ECY lines such as ECY-1 52. These EC lines are connected to dumbbell shaped engineering change links 30 and 32 through vias 34, the combination of these links, lines, and vias comprising the engineering change patterns. At the very base of the substrate 11 is another layer 42 of power conductors providing the power supply.

Surrounding each chip site are a set of ring patterns 43, 44, 45, which are shown in this embodiment as a series of non-intersecting surface metallizations, approximately 25 microns in width, circumscribing each chip. Three patterns may not always be required, if the number of chip pads and the probable engineering change requirements are not great. Conversely, there may be engineering change requirements which dictate that more than three patterns be used. The use of these patterns in making engineering changes will become apparent hereafter. It is not necessary that these ring patterns totally circumscribe the chip site nor is it necessary that they be continuous to implement the present invention.

The subsurface fan-out metallization 126 passes beneath the ring patterns and is connected to the surface of the substrate 11 by a series of vias 210 whose substrate surface intersections 28 are interspersed between and adjacent to the ring patterns 43, 44, 45, as can be seen from the figure. The engineering change links 30, 32 are also connected to subsurface fan-in metallization 33 through the same vias which connect them to the buried EC lines 35, 52. This metallization 33 passes beneath the ring patterns as it fans in towards the device site and is in turn connected to the surface of the substrate 11 by a 29 are also interspersed between and adjacent to the ring patterns 43, 44, 45. These surface pads, like the fan-out pads, are approximately 15 microns in diameter. The interrelationship of the ring patterns, the fan-in metallizations, and the fan-out metallizations in making engineering changes will become readily apparent.

Figure 4:
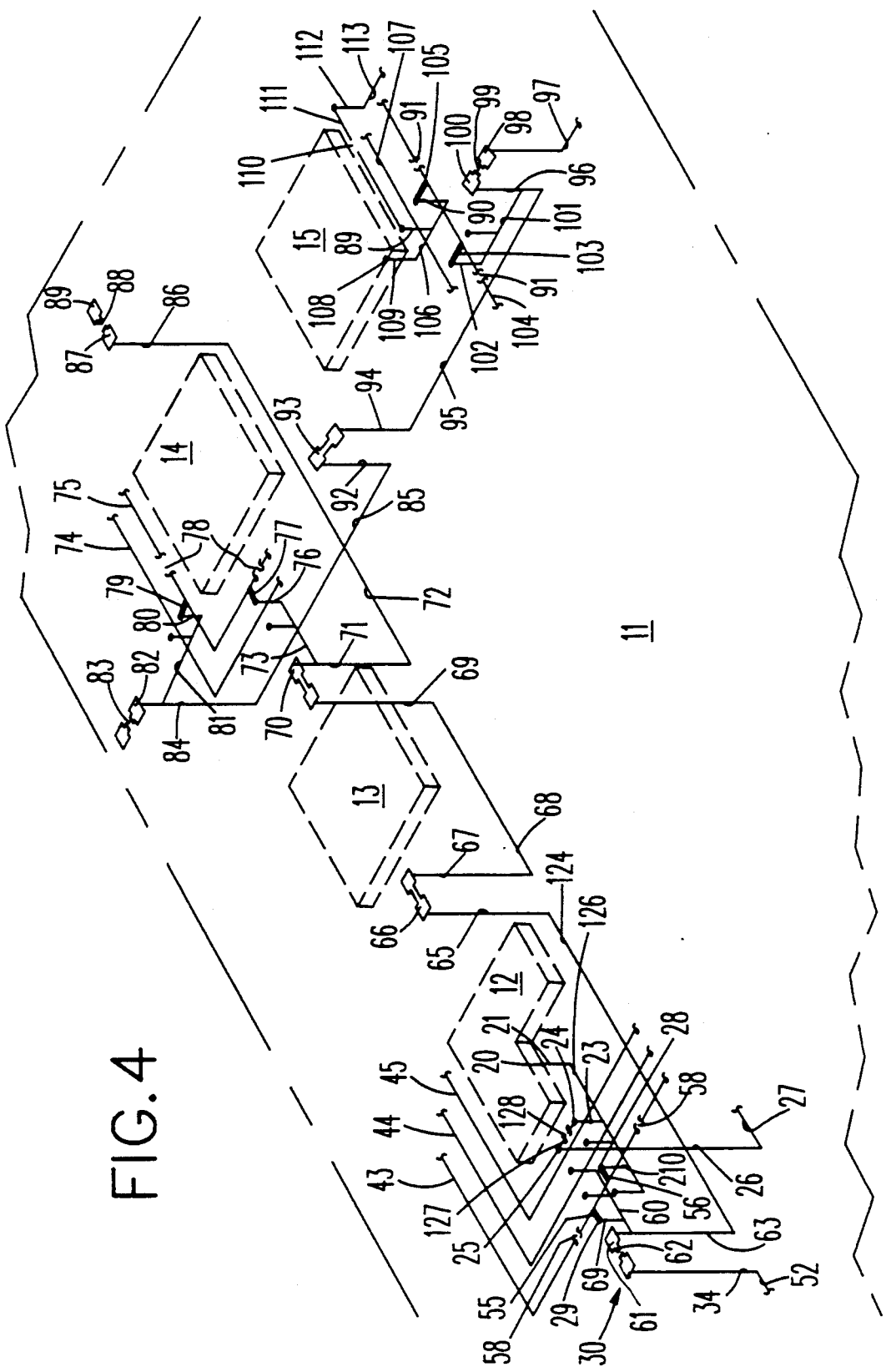
FIG. 4 is a perspective representation of an engineering change connecting the chip pads of two chips and disconnecting the existing connections of those chip pads.

Referring to FIG. 4, chips 12, 13, 14, and 15 are shown. It is desired to connect chip pad 108 of chip 15 to chip pad 20 of chip 12, these pads not being joined when the substrate is originally fabricated. As previously described, pad 20 is connected to network metallization 27 by vias 21, 23, 26, pads 24, 25, and metallizations 126, 127. It is usually desired to break this initial connection path, although this may not always be the case. This connection path may be broken by deleting a portion 128 of LST surface metallization 127 by using an energetic beam or other suitable methods. A preferred beam is a laser beam, although other types of beams may certainly be suitable. In order to perform this operation when the chip is mounted on the substrate, it is desirable that this surface metallization be located outside the periphery of the chip, as is shown in FIG. 4, but this is not always necessary, since many engineering change requirements are identified before the chips are mounted to the substrate.

The chip connection is then connected to ring pattern 43 by a 15 micron by 20 micron cross-section shunt 56 of surface deposited metal, deposited in such a manner to connect pattern 43 to pad 28 and thence to the chip pad by via 210 and fan-out metallization 126. This shunt is interchangeably referred to as a shunt, a direct write shunt, or selectively deposited surface metallization, among other terms. The ring pattern 43 is connected to engineering change link 30 by a similar shunt 55 connecting pattern 43 to pad 29 and thus to the engineering change link through vias 69, 63 and fan-in metallization 60. The direct write shunts may be deposited by any suitable method, a preferred method being selectively deposited laser chemical vapor deposition (LCVD). Other possible methods include various micro-wire bonding techniques. It should be understood that whenever surface deposited metallization is referred to that any of these methods may be used. It is often desirable to isolate the connection to ring pattern 43 made by shunts 55, 56 from the remainder of ring pattern 43, although not necessary to implement a predetermined engineering change unless a particular ring pattern is to be used for more than one engineering change. In order to make optimum use of a ring pattern, this isolation will usually be performed. This isolation is performed by deleting portions 58 of ring pattern 43 in the indicated locations by using an energy beam or some other suitable method. Using a laser beam to perform this delete operation is the preferred method used in this example.

The engineering change link 30 is connected to ECY line 124 by via 63. It is often desirable to isolate this ECY line from the connected ECY line 52 which is not necessary for the predetermined engineering change described in this example, but which is also connected to link 30 by via 34. This is achieved by deleting the thinner portion 62 of the dumbbell shaped link, leaving the thicker portion 61 remaining attached to via 63. This deletion may be performed by using a beam or other suitable method, the method in this example using a laser beam.

ECY line 124 extends beneath chip 12, connecting the surface of the substrate by vias 65, 67 and link 66, and thereby connecting ECY line 68 before passing beneath chip 13. ECY line 68 then connects to surface link 70 by via 69.

Since the desired connection of chip pad 108 is to an ECX link, it is necessary to route the changed signal connection from an ECY line to an ECX line. This is most easily accomplished using the ring patterns surrounding the chip which intersects the ECX and ECY lines in question, but this need not always be the case. The utilization of EC lines on a particular substrate and the criticality of the signal involved will determine what route is used for a particular signal. For purposes of clarity, this specification illustrates only one conversion from an ECY line to an ECX line, namely that which occurs using the ring patterns surrounding chip 14. The connection from engineering change link 70 to engineering change link 82 is made through via 71, fan-in metallization 73, via 76, surface deposited shunt 77, ring pattern 75, surface deposited shunt 79, via 80, fan-in metallization 81, and via 84, in like manner as the connection from chip pad 20 to link 61 was made. The ring pattern connection is isolated at 78, while link 82 is isolated by deleting portion 83, and ECY line 72 is isolated by deleting a portion 88 of link 87.

The changed signal connection is then routed to ECX line 85 by via 84, passes beneath chip 14, and is then connected to ECX line 95 by vias 92, 94 and link 93. It passes beneath chip 15 and is connected to link 100 by via 96.

Pad 108 under chip 15 is connected to its network metallization 113 by vias 109, 89, 112, fan-out metallization 106, and surface LST metallization 111. This connection is broken, if necessary, by deleting a portion 110 of surface LST metallization 111 using an energy beam or other suitable method, the method in this example by using a laser beam.

Chip pad 108 is then routed to the changed connection of chip pad 20 by fan-out metallization 106, via 90, surface deposited shunt 105, ring pattern 104, surface deposited shunt 103, via 102, fan-in metallization 101, and via 96 at link 100. If necessary, this connection is isolated from the remainder of ring pattern 104 by deleting portions 91 and isolated from the remainder of the ECX pattern, by deleting portion 99 of link 100, thereby allowing ECX line 97 to be used for other engineering changes.

Figure 5:
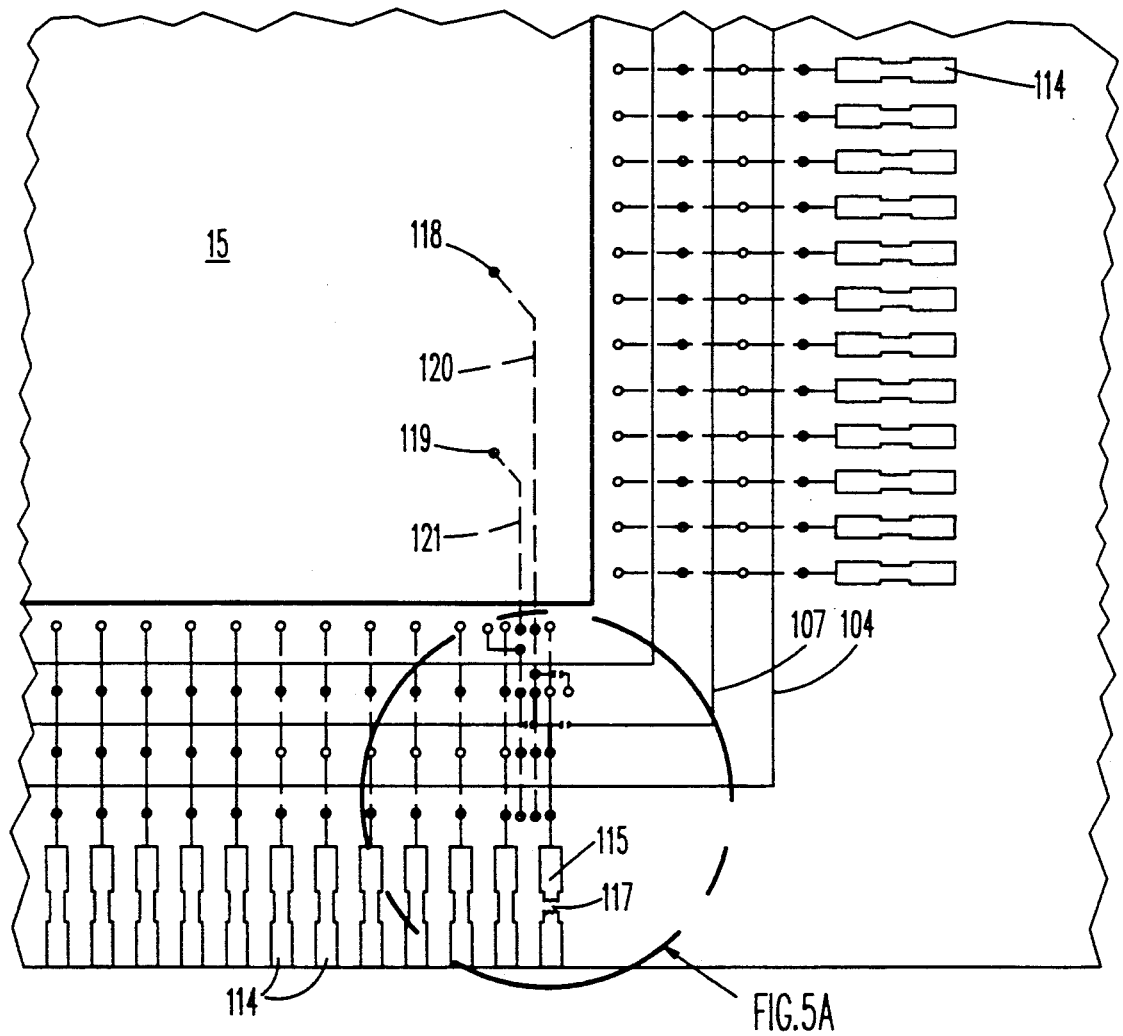
FIGS. 5 to 9C are plan views of various embodiments of the invention showing a portion of a device site and illustrating the wiring of the system and the engineering change.
Figure 5A:
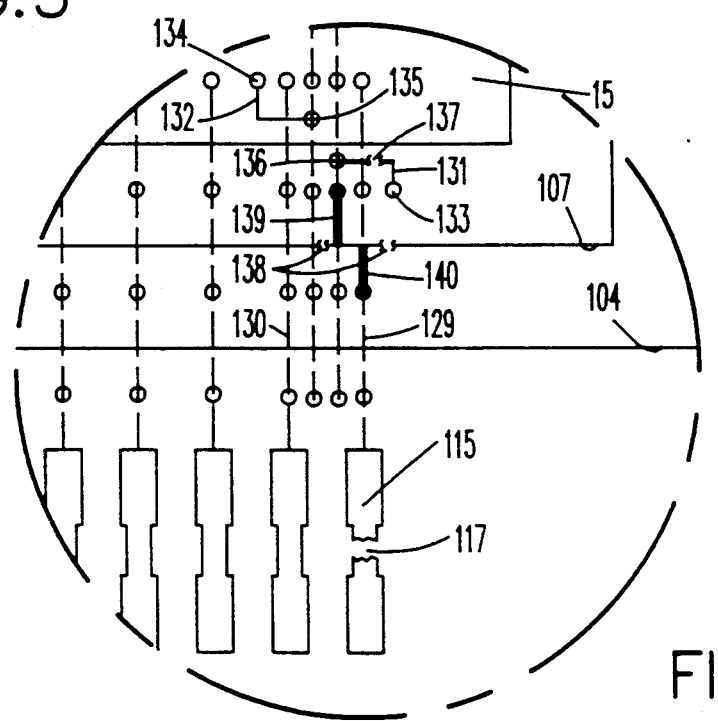

Numerous combinations of engineering changes can be made by using a pattern of ECX and ECY lines extending throughout a substrate. FIG. 5 shows a quadrant of chip 15 with numerous engineering change links 114 surrounding the chip. Each of these links is in turn connected to an ECX or an ECY line. Chip pads 118 and 119 are connected to their respective network metallizations by fan-out metallizations 120, 121, surface LST metallizations 131, 132, and vias 133, 134, 135, 136, as shown in FIG. 5A. In this configuration both fan-out metallizations are located between a single pair of fan-in metallizations 129, 130. The other fan-out metallizations which are located between the other sets of fab-in metallizations are omitted for clarity. Chip pad 118 may be connected to link 115 by surface deposited shunts 139, 140 and ring pattern 107, with isolation deletions 117, 137, 138 being made as appropriate.

It should be noted that although the present invention has been described with respect to a set of chips mounted on a substrate, it is not limited to this configuration. Other sets of substrates and device sites may be used and fall within the scope of the invention. In particular, the substrate may comprise an integrated circuit chip itself with the device sites comprising distinct groups of circuits on that integrated circuit chip which are an integral part of the insulating and conductive layers of the integrated circuit. The interconnection techniques, methods for isolating connections, and metallization deposition techniques described in the present invention are all applicable to these other combinations of substrates and device sites.

It is possible to have more ring patterns and more fan-out metallizations between a single set of engineering change links and fan-in metallizations, depending on the engineering change requirements. It is possible, for example, to have 600 fan-out metallizations from chip pads with 6 mm square chips on 11.2 mm centers. This is achieved with 6 fan-out metallizations between each set of engineering change links and fan-in metallizations and with 7 ring patterns. Twenty-five change links are located on each side of the chip for a total of 100. It is therefore possible to make engineering changes to up to 100 of these 600 chip connections. In actual applications, it is unlikely that so many changes would be required out of a group of 600 connections, but the capability exists.

In FIGS. 5 to 9 dashed lines generally indicate subsurface wiring while solid lines generally indicate surface wiring.

Figure 6:
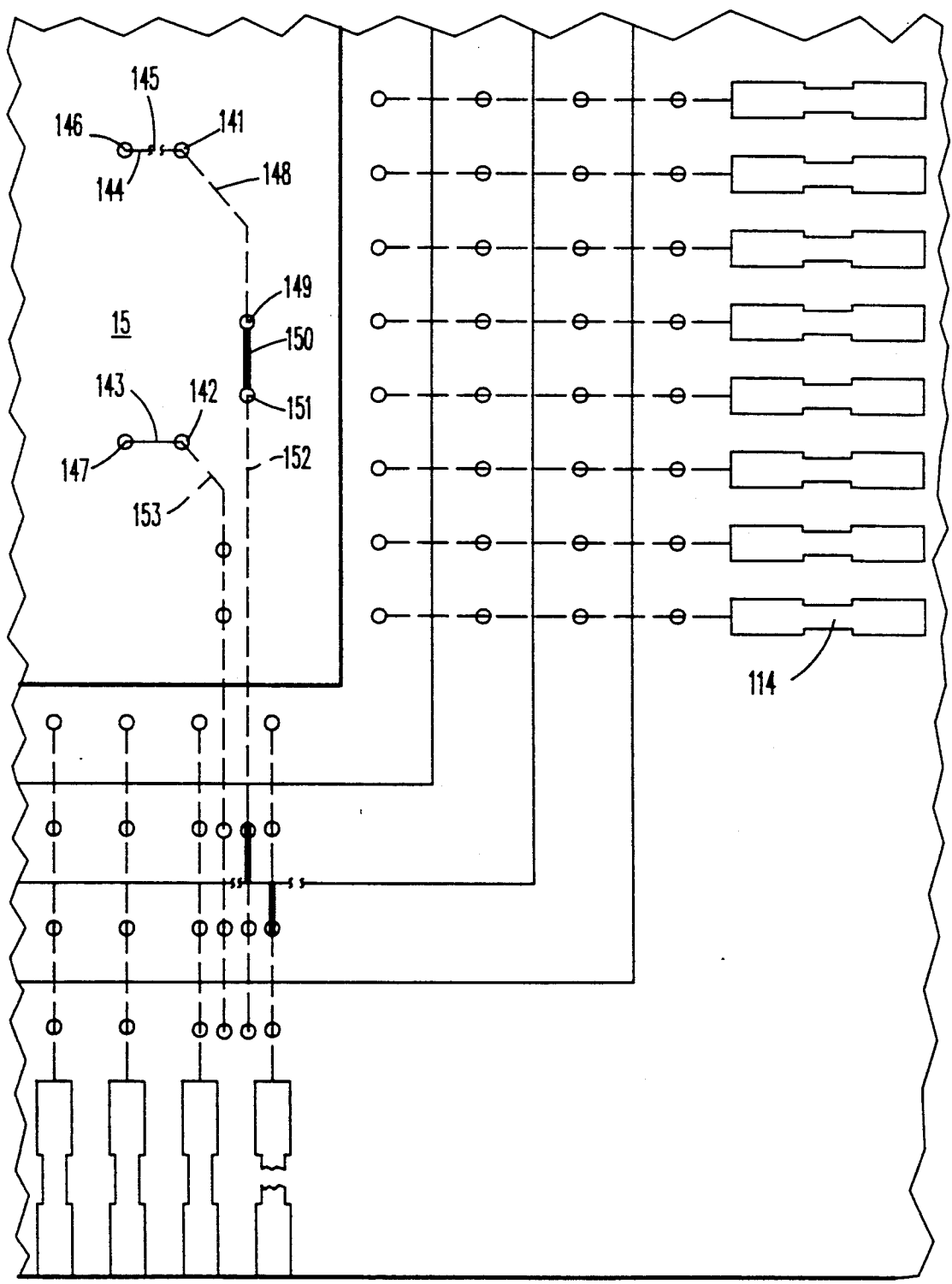

Referring to FIG. 6, a different aspect of the present invention is shown. In this configuration, the chip connections 141, 142 do not connect through fan-out metallization to a first set of fan-out pads, but rather connect directly through surface LST metallizations 143, 144 to LSTs 146, 147 and then connect directly to the network metallization through vias. The engineering change connection for chip pad 141 is made in the same manner as previously described: the fan-out metallization is connected to a ring pattern by a surface deposited shunt, the ring pattern then being connected to the fan-in metallization and engineering change link by another surface deposited shunt. The isolation of the network metallization from the fan-out metallization is made by deleting a portion 145 of the surface LST metallization by an energy beam or other suitable means, in the example shown by a laser beam.

In the case where the chip pad connection is not changed, this being the predominant case, the fan-out metallization will add a stub capacitance to the interconnect pathway electrical characteristics, not being part of the primary current path, with a resulting increase in signal propagation delay unless it is connected only when making an engineering change. This stub capacitance can be reduced by separating the fan-out metallization into an initial portion 148 and a final portion 152, these two portions connected to the surface of the substrate by vias 149, 151, but not connected to each other unless an engineering change is required. When the change is required the vias 149,151, can be completed by a direct write surface deposited shunt 150, thus completing the fan-out metallization conductive path.

As depicted in FIG. 6, the LSTs, surface LST metallization, and fan-out metallization are all located within the periphery of the device site. In this configuration, engineering changes can only be made before the chip is mounted or if the chip is removed. This is acceptable in most cases because substrate defects or design changes will usually be identified before chips are mounted to the substrate.

Figure 7:
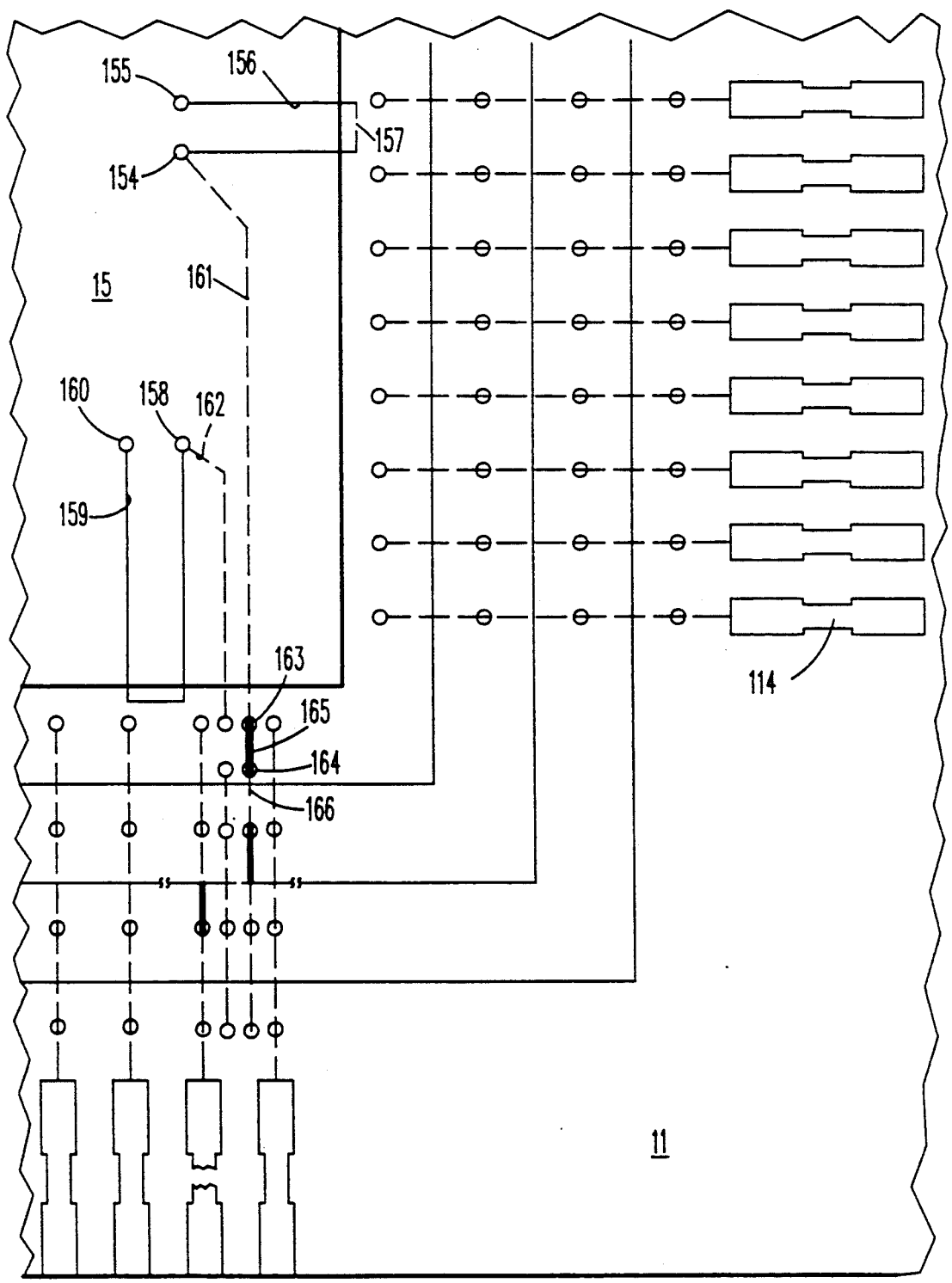

It may be desirable to have the LSTs located within the periphery of the chip site, saving substrate area, and still have the capability to make engineering changes when a chip is mounted to the substrate. A configuration with this capability is shown in FIG. 7. The chip pads 154, 158 and LSTs 155, 160 are located within the chip site periphery, but the LST metallizations 156, 159 connecting these pads extend at least partially beyond the periphery of the chip. In this way the chip pad can be disconnected from the network metallization by deleting a portion 157 of the LST metallization where it extends beyond the periphery of the chip site, eliminating the need for removing a chip if an engineering change is desired after the chip is mounted. The fan-out metallization can also be separated into an initial portion 161 and a final portion 166, with the two portions connected when the engineering change is desired by a surface metal shunt 165 which is deposited between two vias 163, 164 and external to the periphery of the chip site.

Figure 8:
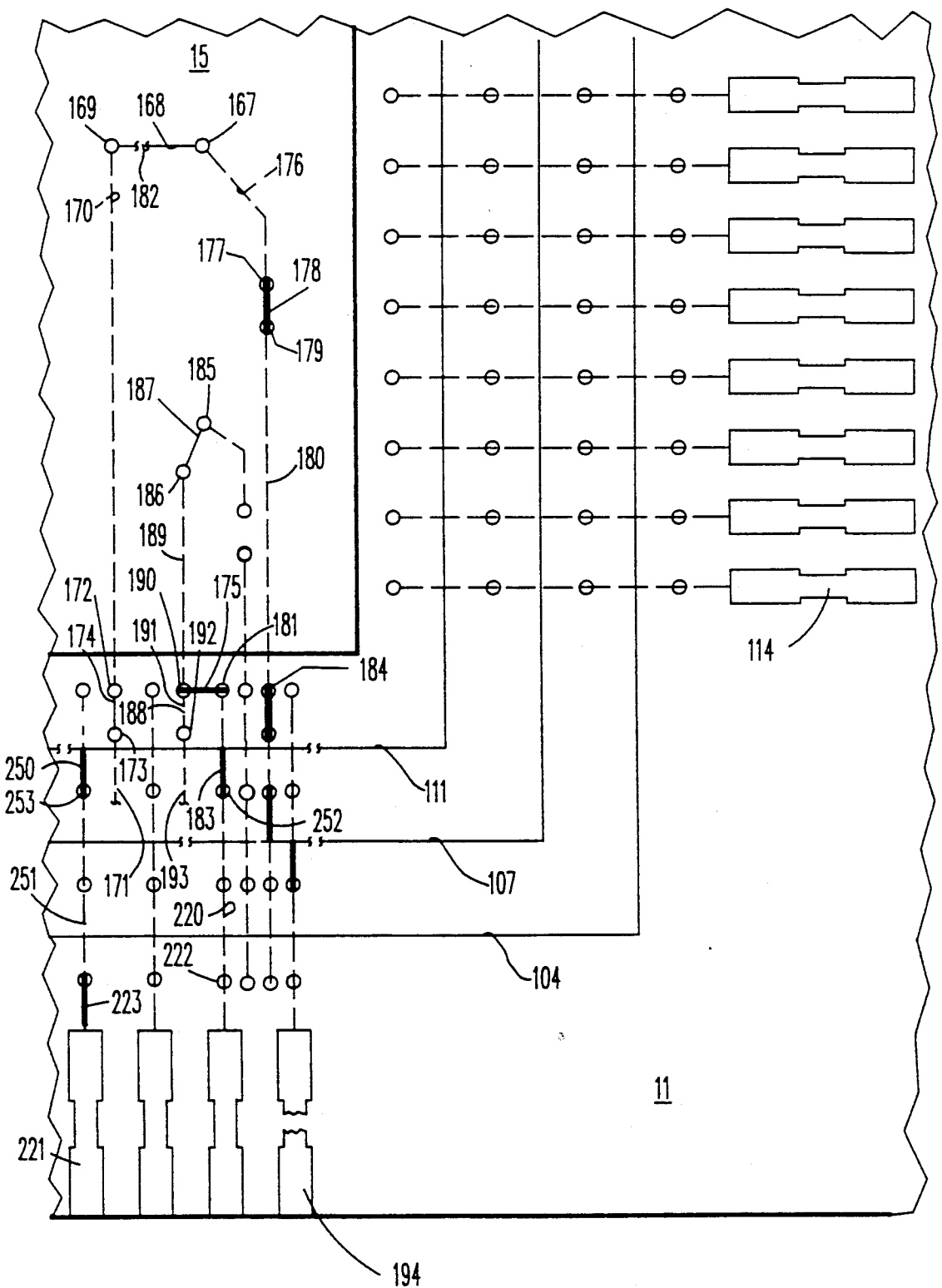

To retain the maximum flexibility in making engineering changes, it is desirable to have the option of making the necessary modification either interior or exterior to the chip site. A configuration illustrating this flexibility is shown in FIG. 8. The chip pads 167, 185 are connected to network metallization through first surface LST metallizations 168, 187 and intermediate pads 169, 186. Sub-surface metallizations 170, 189 connect pads 169, 186 to vias 172, 190. The network metallizations 171, 193 are connected to subsurface metallizations 170, 189 outside the periphery of the chip site by vias 172, 190, second surface LST metallizations 174, 191 and LSTs 173, 192. The chip connection to the network metallization may then be disconnected prior to mounting the chip by deleting a portion 182 of the first surface LST metallization 168.

In this case the initial portion 176 and the final portion 180 of the fan-out metallization for chip pad 167 are connected by via 177, surface deposited shunt 178, which is interior to the periphery of the chip, and via 179. The final portion 180 of the fan-out metallization is then connected to the change link 194 through ring pattern 107, etc., in the manner previously described.

If a change is desired subsequent to mounting the chip, a portion 188 of second surface LST metallization is deleted. Via 190 is then connected to via 181 by surface deposited shunt 175 and thereby connected to fan-in metallization 220. The signal can then be routed to fan-in metallization 251, for example, by via 252, shunt 183, ring pattern 111, shunt 250, and via 253.

An additional feature of the invention is the completion of the engineering change by selectively deposited surface metallization 223 completing the connection between fan-in metallization 251 and change link 221. Requiring this metallization 223 to complete the circuit prevents fan-in metallization 251 from creating an additional stub capacitance in the event link 221 is used for an engineering change at a chip site adjacent to chip site 15 rather than at chip site 15 itself.

Figure 9:
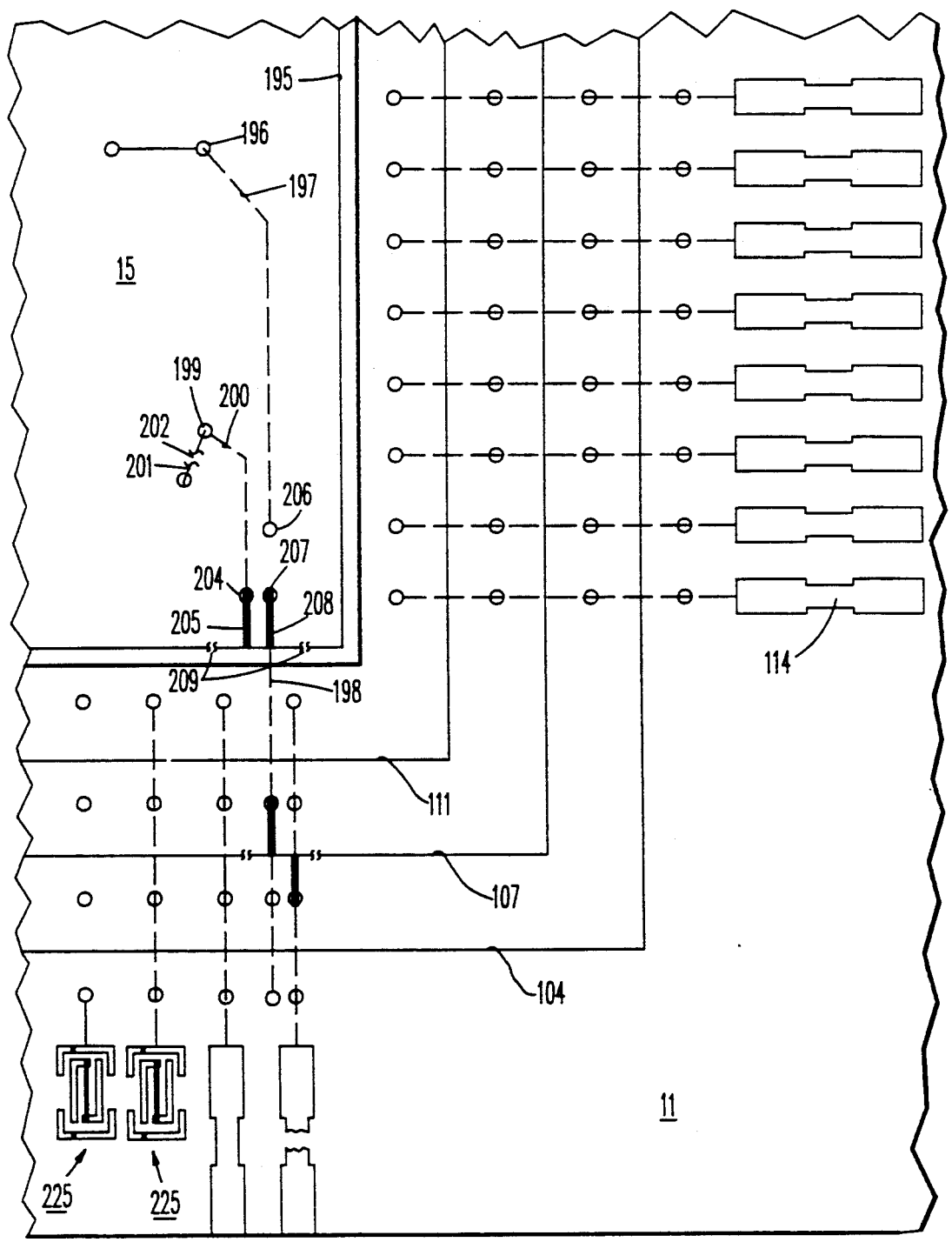

To further enhance the number of chip pad connections which can be changed with a given set of geometric constraints, it is desirable to use a single fan-out metallization to accommodate more than one chip pad. The change capability can be at least doubled in this manner. Referring to FIG. 9, a surface metallization pattern 195 distinct from the ring patterns 104, 107, 111 and circumscribing or substantially circumscribing the device site is shown. The chip pads 196, 199 are connected to initial portions of fan-out metallization 197, 200 which terminate at vias 204, 206. The final portion 198 of the fan-out metallization is connected to the surface of the substrate at the point closest to the initial portions by via 207. By connecting these initial portions 197, 200 to the final portion 198, either directly or through the circumscribing metallization 195, a single final portion of fan-out metallization can be used for at least two chip pads, although only one chip connection can be changed at a given time. To illustrate an engineering change applied to chip pad 199, the network metallization connection is disconnected by deleting a portion 202 of surface LST metallization 201. A surface metal shunt 205 is then deposited between via 204 and pattern 195. A second surface metal shunt 208 is then deposited between via 207 and pattern 195, connecting the initial and final portions of the fan-out metallization. If necessary, the connections to the pattern 195 are isolated by deleting portions 209 of the pattern. The remainder of the connection to the change link is made in the manner previously described.

As previously mentioned, a portion of an electrical path which is not part of a primary current path will add a stub capacitance to the circuit with an accompanying increase in signal propagation delay. Referring to FIG. 4, the use of change link 70 to route the signal to fan-in metallization 73 results in such a stub capacitance since ECY line 72 is connected but is not a primary current path.

Figure 9A:
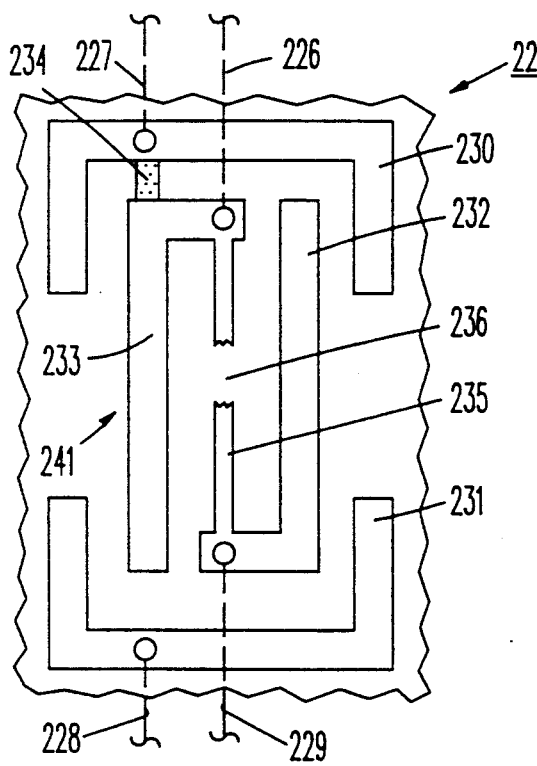

A novel surface metallization link 225 is shown in FIG. 9 which can be used to reduce stub capacitance problems. Referring to FIG. 9A, the link 225 is composed of three parts: A first surface metallization 230, a second surface metallization 241, and a third surface metallization 231. The first and third metallization are in the form of opposing U-shaped members which enclose the second metallization 241. The second metallization 241 is composed of two L-shaped members 232, 233 connected by a deletable link 235 and is disposed between the first and third metallizations.

The first metallization 230 is connected to fan-in metallization 227 of chip site 15. The third metallization 231 is connected to fan-in metallization 228 of the chip site adjacent to chip site 15. The second metallization 241 is connected to ECY lines 226, 229 which comprise a portion of an engineering change pattern.

FIG. 9A shows a configuration used to route an engineering change signal onto ECY line 226 beneath chip site 15 from fan-in line 227. First metallization 230 is connected to member 233 of second metallization 241 by selectively deposited surface metallization 234. As previously described, this surface metallization can be deposited by any suitable method, preferably laser CVD. Link 235 then has a portion 236 deleted by a beam or other suitable method, the preferred method being using a laser beam. The signal is thus routed on ECY line 226 and any stub capacitance which ECY line 229 would contribute is eliminated.

Figure 9B:
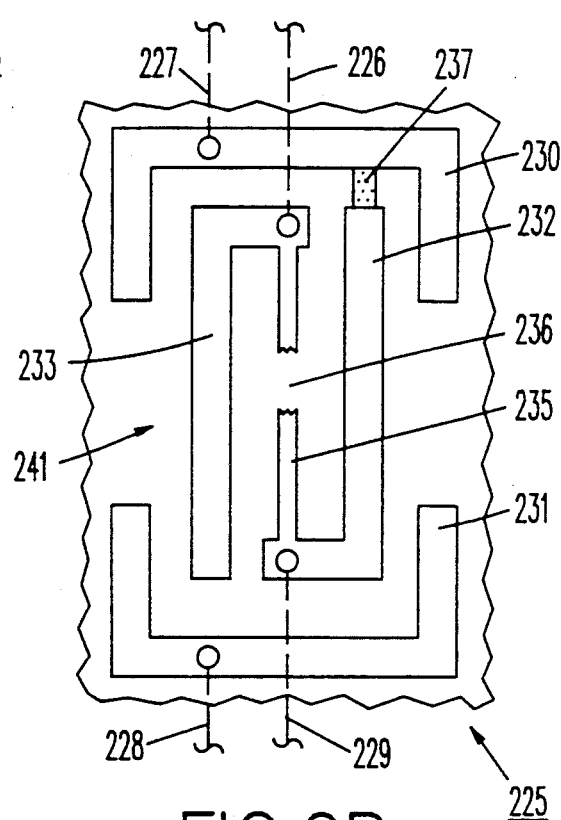

FIG. 9B shows a configuration where the signal is routed to ECY line 229 from fan-in line 227. First metallization 230 is connected to member 232 of second metallization 241 by selectively deposited surface metallization 237. Link 235 then has portion 236 deleted, routing the signal to ECY line 229.

Figure 9C:
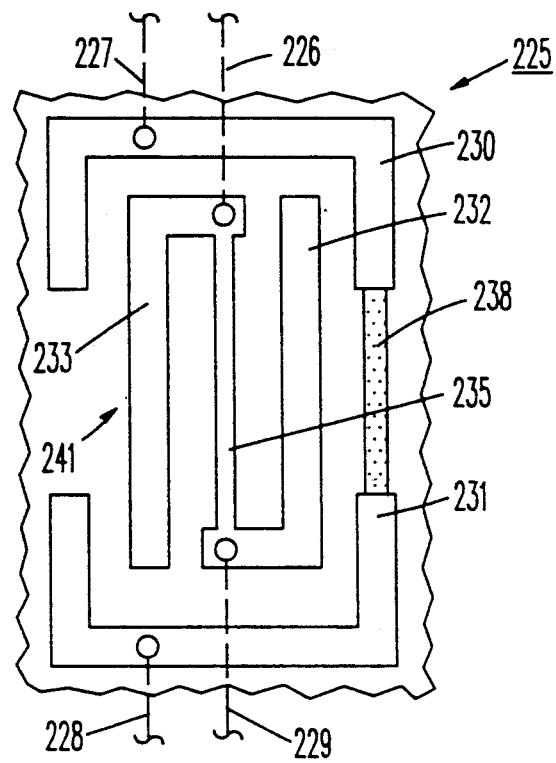

FIG. 9C shows a configuration where a signal is routed from fan-in line 227 to fan-in line 228 via first metallization 230, selectively deposited surface metallization 238, and third metallization 231. In this configuration, the signal is not routed onto any EC line. This configuration is suitable for making an ECY line to ring pattern connection without excess stub capacitance as part of an ECY line to ECX line transition, such as the transition using the ring pattern of chip site 14, previously described and shown in FIG. 4.

As set forth in this description, metallizations 230, 241, and 231 are not electrically connected prior to making an engineering change. After the engineering change is made a predetermined pair of these metallizations are electrically connected by the surface metallization.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. An electronics system comprising:
a supporting substrate composed of layers of insulating and conducting material;
a plurality of device sites on said substrate;
electrical interconnections between a multiplicity of said device sites;
means for changing said electrical interconnections between device sites comprising:
at least one electrically conductive ring pattern at least partially surrounding each device site;
a series of engineering change patterns which extend at least between adjacent device sites;
means for connecting a predetermined interconnection to said ring pattern; and
means for connecting said ring pattern to at least one engineering change pattern, wherein said interconnection between the device sites is comprised of:
a set of chip pads adapted for connection of a semiconductor chip thereto;
a set of fan-out pads;
fan-out subsurface metallization connected to said chip pads and said set of fan-out pads;
surface LST metallization which connects said set of fan-out pads to logic service terminals (LSTs); and
network subsurface metallization connected to said logic service terminals.

2. The system of claim 1 wherein said at least one ring pattern comprises a series of non-intersecting surface metallizations which circumscribe said device sites.

3. The system of claim 2 wherein said fan-out metallization extends beneath said ring patterns and wherein said predetermined interconnection connecting means comprises:
a set of connecting metallized wiring vias which connect said fan-out metallization to the surface of said substrate, said wiring vias spaced adjacent to said ring patterns; and
selectively deposited surface metallization connecting at least one of said connecting vias with at least one of said ring patterns.

4. The system of claim 2 wherein said engineering change pattern connecting means comprises:
an engineering change surface metallization link;
fan-in subsurface metallization passing beneath said ring patterns and connected to said engineering change link;
a set of fan-in metallization vias which connect said fan-in metallization to the surface of said substrate, said wiring vias spaced adjacent to said ring patterns; and
selectively deposited surface metallization connecting at least one of said fan-in metallization vias with at least one of said ring patterns.

5. The system of claim 4 wherein said surface metallization link comprises:
first surface metallization connected to the fan-in metallization of a predetermined device site;
second surface metallization connected to said engineering change pattern, said second metallization including a deletable link;
third surface metallization connected to the fan-in metallization of a device site adjacent to said predetermined device site; and
selectively deposited surface metallization connecting a predetermined pair of said surface metallizations.

6. The system of claim 5 wherein said first metallization comprises a first U-shaped member, said third metallization comprises a second U-shaped member opposed to said first U-shaped member, and said second metallization is disposed between said first and third metallizations and comprises two L-shaped members connected by said deletable link, wherein said first, second, and third metallizations are not in electrical contact with each other before engineering changes are performed.

7. The system of claim 1 wherein said surface LST metallization is located exterior to the periphery of said device site.

8. An electronics system comprising:
a supporting substrate composed of layers of insulating and conducting material;
a plurality of device sites on said substrate;
electrical interconnections between a multiplicity of said device sites;
means for changing said electrical interconnections between device sites comprising:
at least one electrically conductive ring pattern at least partially surrounding each device site;
a series of engineering change patterns which extend at least between adjacent device sites;
means for connecting a predetermined interconnection to said ring pattern; and
means for connecting said ring pattern to at least one engineering change pattern, wherein said interconnections between the device sites is comprised of:
a set of pads adapted for connection of a semiconductor chip thereto;
LST metallization which connects said pads to a set of logic service terminals; and
network subsurface metallization connected to said logic service terminals.

9. The system of claim 8 wherein said at least one ring pattern comprise a series of non-intersecting surface metallizations which circumscribe said device sites.

10. The system of claim 9 wherein said predetermined interconnection connecting means comprises:
fan-out subsurface metallization passing beneath said ring patterns and connected to said chip pads;
a set of connecting metallized wiring vias which connect said fan-out metallization to the surface of said substrate, said wiring vias spaced adjacent to said ring patterns; and
selectively deposited surface metallization connecting at least one of said connecting vias with at least one of said ring patterns.

11. The system of claim 10 wherein the fan-out metallization comprises an initial portion of subsurface metallization connected to said chip pad and a final subsurface portion of said fan-out metallization passing beneath said ring patterns, wherein said initial and final portions are not connected.

12. The system of claim 11 wherein said initial and final portions of said fan-out metallization are connected by surface metallization.

13. The system of claim 12 wherein said surface metallization is selectively deposited surface metallization.

14. The system of claim 12 wherein said surface metallization circumscribes said device site and is distinct from said ring patterns.

15. The system of claim 12 wherein said surface metallization comprises:
metallization circumscribing said device site distinct from said ring patterns;

selectively deposited surface metallization connecting said initial portion of metallization to said circumscribing metallization; and selectively deposited surface metallization connecting said final portion of metallization to said circumscribing metallization.

16. The system of claim 11 wherein said surface metallization connected to said initial and final portions is located exterior to the periphery of said device site.

17. The system of claim 9 wherein said engineering change pattern connecting means comprises:

an engineering change surface metallization link;

fan-in subsurface metallization passing beneath said ring patterns and connected to said engineering change link;

a set of fan-in metallization wiring vias which connect said fan-in metallization to the surface of said substrate, said wiring vias spaced adjacent to said ring patterns; and selectively deposited surface metallization connecting at least one of said fan-in metallization vias with at least one of said ring patterns.

18. The system of claim 17 wherein said surface metallization link comprises:

first surface metallization connected to the fan-in metallization of a predetermined device site;

second surface metallization connected to said engineering change pattern, said second metallization including a deletable link;

third surface metallization connected to the fan-in metallization of a device site adjacent to said predetermined device site; and selectively deposited surface metallization connecting a predetermined pair of said surface metallizations.

19. The system of claim 18 wherein said first metallization comprises a first U-shaped member, said third metallization comprises a second U-shaped member opposed to said first U-shaped member, and said second metallization is disposed between said first and third metallizations and comprises two L-shaped members connected by said deletable link, wherein said first, second, and third metallizations are not in electrical contact with each other before engineering changes are performed.

20. The system of claim 8 wherein both of said LST metallization and said logic service terminals are located within the periphery of said device site.

21. The system of claim 8 wherein said logic service terminal is located within the periphery of said device site and wherein said LST metallization extends at least partially exterior to said device site.

22. The system of claim 8 wherein said LST metallization comprises:

an initial portion of surface metallization connected to intermediate pads; and a final portion surface metallization connecting said initial portion to the remainder of said network metallization.

23. In an electronics system comprising a supporting structure composed of layers of insulating and conducting material, a plurality of device sites, and electrical interconnections between a multiplicity of said devices sites, a method for changing said electrical interconnections between device sites comprising the following steps:

connecting a predetermined interconnection to an electrically conductive ring pattern at least partially surrounding each device site;

connecting said surrounding ring pattern to an engineering change electrically conductive pattern which extends at least between adjacent device sites, and further comprising disconnecting said predetermined interconnection from its initial connection and isolating said changed electrical interconnection from the remainder of said ring pattern and from the remainder of said engineering change pattern said disconnecting step comprised of deleting a portion of LST metallization.

24. The method of claim 23 wherein said deleting comprises using a beam to achieve said deleting.

25. The method of claim 24 wherein said beam is a laser beam.

26. In an electronics system comprising a supporting structure composed of layers of insulating and conducting material, a plurality of device sites, and electrical interconnections between a multiplicity of said devices sites, a method for changing said electrical interconnections between device sites comprising the following steps:

connecting a predetermined interconnection to an electrically conductive ring pattern at least partially surrounding each device site;

connecting said surrounding ring pattern to an engineering change electrically conductive pattern which extends at least between adjacent device sites, disconnecting said predetermined interconnection from its initial connection and isolating said changed electrical interconnection from the remainder of said ring pattern and from the remainder of said engineering change pattern, said wherein said isolating step comprises deleting a portion of said ring patterns and said engineering change patterns.

27. The method of claim 26 wherein said deleting comprises using a beam to achieve said deleting.

28. The method of claim 27 wherein said beam is a laser beam.

29. In an electronics system comprising a supporting structure composed of layers of insulating and conducting material, a plurality of device sites, and electrical interconnections between a multiplicity of said devices sites, a method for changing said electrical interconnections between device sites comprising the following steps:

connecting a predetermined interconnection to an electrically conductive ring pattern at least partially surrounding each device site, comprised of selectively depositing surface metal to connect said ring pattern with the substrate surface intersection of a via which is connected to a chip pad of one of said device sites; and connecting said surrounding ring pattern to an engineering change electrically conductive pattern which extends at least between adjacent device sites.

30. The method of claim 29 wherein said selective deposition comprises laser chemical vapor deposition.

31. An electronics systems comprising:

a supporting substrate composed of layers of insulating and conducting material;

a plurality of device sites on said substrate;

electrical interconnections connecting at least two of said device sites; and means for changing said electrical interconnections between device sites comprising:

at least one electrically conductive ring pattern at least partially surrounding each device site;

engineering change wiring which extends at least between adjacent device sites;

subsurface fan-out wiring which extends from said device site outwardly, said fan-in wiring connected to said ring pattern by selectively deposited surface metallization; and subsurface fan-in wiring which extends from said engineering change wiring inwardly toward said device site.

32. The electronics system of claim 31 wherein said interconnections between the device sites comprise:

subsurface network metallization extending to at least one other location on said substrate; and surface metallization connecting said network metallization to one of said fan-out wiring and fan-in wiring.

33. The electronics system of claim 31 wherein said fan-in wiring is connected to said ring pattern by selectively deposited surface metallization.

34. The electronics system of claim 31 wherein said fan-in wiring and said fan-out wiring are connected to each other by selectively deposited surface metallization.

35. The electronics system of claim 31 wherein the means for changing interconnections between device sites further comprises selectively removed surface metallization from said substrate so as to isolate said changed electrical interconnection from the remainder of said ring patterns and engineering change wiring.

36. The electronics system of claim 31 wherein said fan-in wiring further comprises a set of wiring vias spaced among the ring pattern, said wiring vias connecting between said fan-in wiring and said ring pattern.

37. The electronics system of claim 31 wherein said fan-out wiring further comprises a set of wiring vias spaced among the ring pattern, said wiring vias connecting between said fan-out wiring and said ring pattern.

38. The electronics system of claim 31 where said ring patterns comprise a series of non-intersecting surface metallizations which circumscribe said device sites.

39. The electronics system of claim 31 wherein said support substrate comprises an electronics multilayer ceramic substrate.

* * * * *